US006966259B2

United States Patent
Kanga et al.

(10) Patent No.: US 6,966,259 B2
(45) Date of Patent: Nov. 22, 2005

(54) PRINTING SLEEVE WITH AN INTEGRATED PRINTING SURFACE

(76) Inventors: Rustom S. Kanga, 1760 N. Milford Creek La., Marietta, GA (US) 30008; Mark A. Borski, 1730 NW. 19$^{TH}$ St., Gresham, OR (US) 97030; Patricia I. Janssen, P.O. Box 4870, Elkton, MD (US) 21922

( * ) Notice: Subject to any disclaimer, the term of this patent is extended or adjusted under 35 U.S.C. 154(b) by 39 days.

(21) Appl. No.: 10/754,297

(22) Filed: Jan. 9, 2004

(65) Prior Publication Data

US 2005/0150406 A1 Jul. 14, 2005

(51) Int. Cl.$^7$ .................................................. B41N 1/00
(52) U.S. Cl. ........................ 101/395; 101/376; 101/493; 430/296
(58) Field of Search .................................. 101/375, 376, 101/401.1, 395, 493; 428/304.4, 424.2, 424.8; 427/402; 430/273.1, 296, 302, 271.1, 11, 14

(56) References Cited

U.S. PATENT DOCUMENTS

| | | | |
|---|---|---|---|
| 4,045,231 A | 8/1977 | Toda et al. | |
| 4,323,636 A | 4/1982 | Chen | |
| 4,391,898 A | 7/1983 | Van der Velden | |
| 4,503,769 A | 3/1985 | Andersen | |
| 4,554,040 A | 11/1985 | Van der Velden | |
| 4,601,928 A | 7/1986 | Van der Velden | |
| 4,656,942 A | 4/1987 | Vertegaal et al. | |
| 4,812,219 A | 3/1989 | Sattrup et al. | |
| 4,903,597 A | 2/1990 | Hoage et al. | |
| 4,949,445 A | 8/1990 | Van Der Meulen et al. | |
| 4,963,404 A | 10/1990 | Jenkins | |
| 5,223,375 A | 6/1993 | Berrier et al. | |
| 5,290,633 A | 3/1994 | Devlin et al. | |
| 5,468,568 A | 11/1995 | Kuhn et al. | |
| 5,760,880 A | 6/1998 | Fan et al. | |
| 5,819,657 A | 10/1998 | Rossini | |
| 5,840,386 A | 11/1998 | Hatch et al. | |
| 6,038,971 A | 3/2000 | Fischer | |
| 6,038,975 A | 3/2000 | Hoffmann et al. | |
| 6,143,451 A * | 11/2000 | Blanchet-Fincher | 430/11 |
| 6,238,837 B1 | 5/2001 | Fan | |
| 6,367,381 B1 * | 4/2002 | Kanga | 101/395 |
| 6,531,184 B2 * | 3/2003 | Bode et al. | 427/385.5 |
| 6,605,410 B2 | 8/2003 | Yang et al. | |
| 6,756,181 B2 * | 6/2004 | Yang et al. | 430/273.1 |
| 2002/0025492 A1 * | 2/2002 | Murphy et al. | 430/271.1 |
| 2002/0069777 A1 * | 6/2002 | Rossini et al. | 101/401.1 |
| 2003/0029378 A1 * | 2/2003 | Bode et al. | 118/409 |
| 2003/0054153 A1 * | 3/2003 | Kuczynski et al. | 428/304.4 |
| 2003/0157285 A1 | 8/2003 | Busshoff et al. | |

* cited by examiner

*Primary Examiner*—Eugene H. Eickholt
(74) *Attorney, Agent, or Firm*—Carmody & Torrance LLP

(57) ABSTRACT

A seamless printing sleeve comprising a hollow cylindrical base and a seamless imageable surface as its outermost layer is described. The imageable surface acts as an integral flexographic printing surface. Preferably the printing sleeve comprises an intermediate photopolymer or resilient polymer layer between the outer surface of the base and the imageable surface. Also, preferably the base is uniformly transparent or translucent to actinic radiation.

25 Claims, 1 Drawing Sheet

PRINTING SLEEVE WITH AN INTEGRATED PRINTING SURFACE

FIELD OF THE INVENTION

The invention reveals a cylindrically shaped printing sleeve which is readily axially mountable and dismountable from a complimentary printing cylinder, which printing sleeve has an integral imageable surface thereon.

BACKGROUND OF THE INVENTION

Historically, in flexographic printing, flat, flexible printing plates, fabricated from photopolymers, were hand mounted onto print cylinders by wrapping the printing plate around the cylinder and adhering it there with using various methods such as clamps, tape, magnets or other similar devices. This process works well, but is labor intensive and great care must be taken to ensure that the registration of the plate on the cylinder is accurate. Typically, a compressible material is inserted between the print cylinder and the printing plate to allow for additional compression during the print process.

In the context of the foregoing printing process, cylindrical printing sleeves could be used to increase the diameter of standard print cylinders to fit various printing jobs. In this case the printing sleeve is fitted over the print cylinder and then the printing plate, and the compressible material if used, is mounted on the printing sleeve. The use of printing sleeves in this manner allows the use of one standard printing cylinder (which are fabricated from high strength metals and are expensive) to be used on a wide variety of print jobs. In this regard, please refer to U.S. Pat. No. 4,903,597, the teachings of which are incorporated herein by reference in their entirety.

Hollow cylindrical sleeves of various configurations are known from U.S. Pat. Nos. 4,391,898; 4,503,769; 4,554,040; 4,601,928; 4,656,942; 4,812,219; 4,949,445; 4,963,404; 5,468,568; 5,819,657; 5,840,386; 6,038,971; and 6,038,975, the teachings each of which are incorporated herein in their entirety. Generally, these sleeves are comprised of a variety of layers of materials optimized for specific effects.

Efforts have been made to combine the printing plate with the printing sleeve. For instance, a product is offered by OEC Graphics, Inc. under the trademark, SEAMEX™, wherein a flat photopolymer printing plate is bonded using heat to a printing sleeve. Problems arise with this process, however, in trying to eliminate the seam caused by the joining of the ends of the flat printing plate. Additionally, the SEAMEX™ process is long and labor intensive. Degradation of image fidelity may also result due to heat history the photopolymer is subjected to.

Published U.S. Patent Application 2003/0157285 to Busshoff discusses a printing sleeve that has a photoimageable material disposed on the surface of the sleeve. It is believed, however, that the printing quality of the sleeves made in accordance with Busshoff suffers, because of poor adhesion of the photoimageable material to the printing sleeve surface. Adhesion issues are particularly troublesome when the photoimageable material is imaged to create fine detail features which are separated from other portions of photoimageable material when developed. In this case, poor adhesion of these fine, stand alone features, will cause a loss of fidelity in printing.

SUMMARY OF THE INVENTION

In accordance with this invention, a printing sleeve with an integral seamless printing surface, preferably thin walled, is provided and sequentially includes (i) a hollow cylindrical base comprised of a polymer resin, (ii) preferably, a compressible layer on the cylindrical base, (iii) a layer of photopolymerized material or other polymerized resilient material, and (iv) a layer of material having an imageable surface. It has been found that the inclusion of an intermediate layer (iii) of photopolymerized material or other polymerized resilient material, which is a continuous layer over the printing sleeve, improves the adhesion of the imageable (photopolymerizable) surface and allows for imaging isolated fine detail features and printing with excellent quality. A description of the manufacturing process for the foregoing printing sleeve is also disclosed herein.

BRIEF DESCRIPTION OF THE DRAWINGS

The following is a brief description of the drawings which should be read in conjunction with the detailed description of the invention.

DETAILED DESCRIPTION OR THE INVENTION

Figure 1:
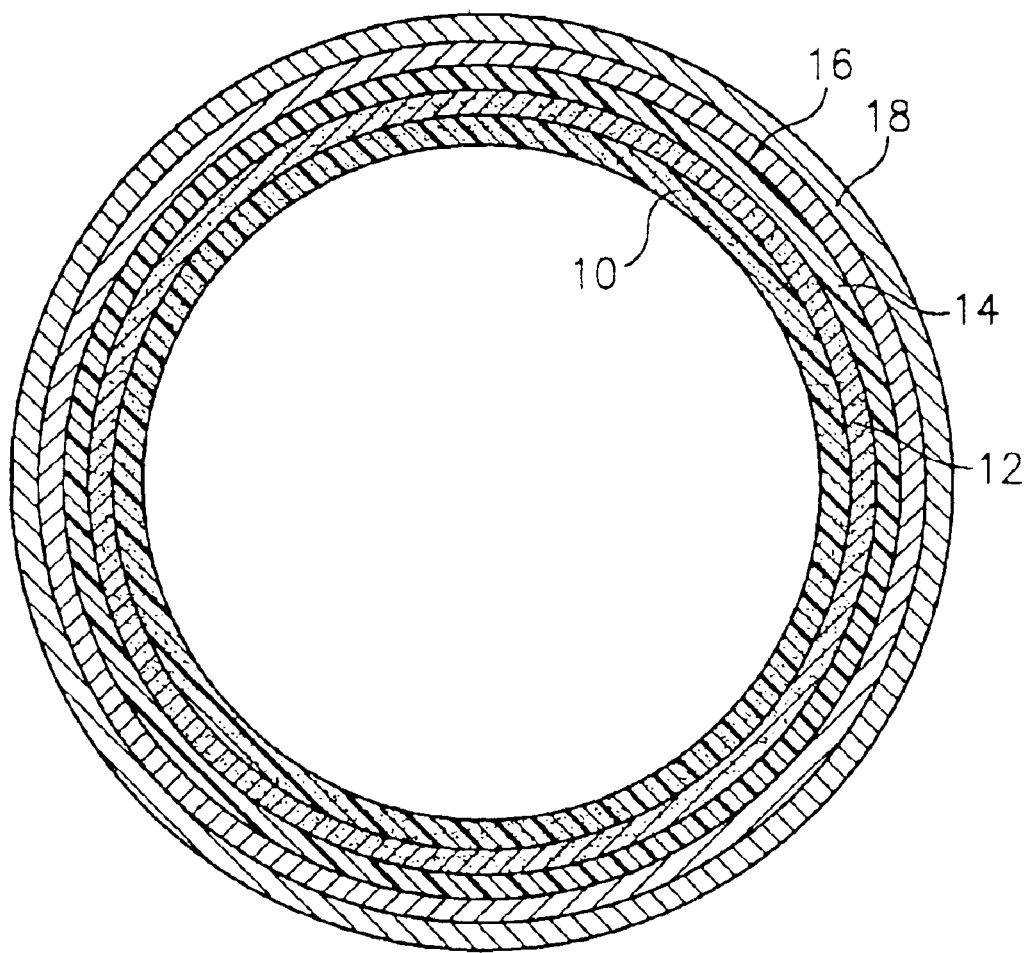
FIG. 1 illustrates a cross section of one embodiment of the hollow cylindrical printing sleeve of the present invention.

The present invention is directed to a hollow cylindrical printing sleeve with an integral imageable printing surface. The printing sleeve of this invention comprises the following elements:

(1) a hollow cylindrical base 10 made of a high strength polymer resin, which is optionally fiber reinforced;

(2) optionally, a layer of compressible material 12;

(3) a layer of photopolymerized photopolymer or other polymerized resilient material called the floor layer 14; Optionally, layers 12 and 14 may be one and the same layer;

(4) at least one layer of an imageable (preferably, photoimageable) material called the imageable layer 16; and (5) optionally, a masking layer 18 which absorbs radiation at the wavelengths used to polymerize the photoimageable material but is selectively removable by laser ablation or other equivalent means.

The hollow cylindrical base 10 can be fabricated using the materials and methods applicable to producing printing sleeves of the prior art, since the hollow cylindrical base 10 is essentially a printing sleeve. However, it is preferred that the base 10 be fabricated from a polymer resin reinforced with a fibrous material such that the base 10 has a seamless surface.

The fibrous material may contain fibers of glass, carbon, metal, ceramic, aramid or any other synthetic long fibers that increase the stability, stiffness, and rigidity of the base 10. Preferably the fibrous material is a fiberglass cloth. The fibrous material content of the base 10 is preferably from about 20 to about 70 by weight.

Preferred resins useful in fabricating the base 10 include polyester resins, phenolic resins and epoxy resins, but epoxy resins are most preferred. Suitable resins include the following commercially available resins: Epoxical resin and Epoxical hardener from Epoxical Inc, of Minnesota and other Epoxy resins from JeffCo and Bakelite, Augusta, Ga. Preferably the base 10 is substantially uniformly transparent or translucent such that actinic radiation can be transmitted through the inner surface of the base 10 to the imageable layer 16. If the base 10 is substantially uniformly transparent or translucent, then preferably no separate compressible layer 12 is used and floor layer 14 can be the same as imageable layer 16, with the floor layer 14 being formed by back exposure through base 10. One method of creating a uniformly transparent or translucent base 10 is by using a relatively clear resin with no fibrous material.

One method of fabricating the base 10 is to serially or repeatedly coat layers of the chosen resin(s) and fibrous material (s) around a rotating mandrel, which is the desired diameter of the interior of the hollow cylinder. Successive layers of resin and fibrous material are applied until the wall thickness of the base 10 is slightly in excess of the desired wall thickness. At this point, the resin is cured using heat, actinic radiation, and/or radiant energy. Base 10 is then separated from the mandrel. The outer diameter of base 10 is then sanded, ground or otherwise machined to size. An alternate method of manufacture would consist of directly extruding the resin and fibrous material to form the required hollow cylinder. The cylinder is then cured and finished to specification.

Preferably, base 10 is flexible and resilient enough for the inside diameter to be expanded slightly using air pressure of about 100 p.s.i. or less, so that it can be easily mounted and dismounted from the printing cylinder. However, when the air pressure is released, the inside diameter of base 10 must retract to its original specified internal diameter such that it fits snuggly onto the printing cylinder. Air pressure for this operation is delivered through small holes in printing cylinder surface such that when applied, air fills the space between the outer surface of the printing cylinder and the inner surface of the base 10, thereby temporarily expanding the inside diameter of the base 10 allowing the base 10 to be easily mounted or dismounted from the printing cylinder. The base 10 usually ranges from about 10 mils to 100 mils in thickness.

Once base 10 is fabricated, a layer of compressible material 12 is optionally applied to the outer surface of base 10. The compressible layer can take a number of forms. The compressible material 12 may consist of a layer of solid foam material which is adhesively bonded to the outer surface of the base 10. In this case, an undesirable seam will be created where the ends of the solid foam meet. Alternatively, and preferably, the layer of compressible material 12 may be formed by uniformly mixing hollow microspheres with an uncured photocurable or thermally curable resin formulation. The resin/microsphere mixture is then applied to base 10 in a layer or layers using a knife or extrusion to provide uniform thickness. The resin microsphere layer is then cured using heat, actinic radiation, and/or radiant energy as appropriate. Preferably, electron beam curing is advantageously used for curing the microsphere compressible foam layer. In a third alternative, a soft resilient polymer such as a polyurethane, or softer version of the Styrene-isoprene-styrene or styrene-butadiene-styrene photocurable layer may be used as the compressible material. In this case, the uncured material is similarly applied using a knife or extrusion to ensure uniform thickness and then cured in place. After application and photocuring the compressible layer is preferably further grounded or sanded to achieve a seamless surface. Either of the second or third alternatives creates a preferred seamless layer.

The thickness of the layer of compressible material can vary depending upon the material being used and the particular printing application. Generally, if a layer of compressible material is used, the thickness of the layer may range from about 20 mils to 40 mils. This thickness of the compressible layer assures wide latitude of approximately 20 mils impression during the printing without significant dot gain. The cured layer of compressible material can be sanded, ground, or otherwise machined to specification and to achieve a seamless surface.

Next, whether the layer of compressible material is used or not, a substantially continuous layer of photopolymer or other resilient polymeric material is applied on the outer surface of base 10 or if used, on the outer surface of the layer of compressible material. As used herein, this substantially continuous layer of photopolymer or other resilient polymeric material is called the floor layer 14. It is entirely possible that the compressible layer 12 and the floor layer 14 are one and the same. If the floor and compressible layers are the same, microspheres can be included in the polymer/photopolymer composition to increase its compressibility. Preferably, the floor layer 14 comprises a photopolymer, which is subsequently cured before the imageable layer 16 is applied. The photocuring of the floor layer is achieved by face exposure to actinic radiation for a certain length of time through the front. Once again, the floor layer 14 after curing is preferably sanded, ground, or otherwise machined to specification and to achieve a seamless surface. The purpose of the floor layer 14 is to ensure that the imageable layer 16 has excellent adhesion and remains firmly attached to the hollow cylindrical base structure, even when very fine isolated structures are developed in the imageable layer 16. The floor layer 14 also gives physical support to fine dots and lines during the printing process. This is especially critical for constructions where the total imageable photopolymer and floor layers are relatively thin (~28–30 mil total). The floor layer as used herein (face exposure from the front) also assures extreme uniformity of the relief layer which is necessary for high-end printing applications where floor variation will create degradation of image fidelity. Also, since the floor layer can be completely cured from the front, it assures a very dry surface after the processing step and post-exposure/ detack steps. It is preferable for the floor layer to comprise the same photopolymer as is present in the imageable layer. In any case, it is important for the floor layer to exhibit good adhesion to the layer below and to the imageable layer. Photocurable Styrenic block copolymers generally work well in providing an adequate floor layer.

For flat plates, the floor layer is obtained by back exposing through the backing which is usually a commercially available polyethylene terephthalate ("PET"). During back exposure, the amount of light going through the backing can be controlled precisely because typically the UV absorption of backing PET's is very uniform across the plate. If need be the PET can be doped with UV attenuating moieties to increase the uniformity of back exposure for fast curing photopolymers. However, for the base substrate sleeves of the current invention, having a combination of binder and fiber, the absorption of actinic radiation is very non-uniform. Thus it was found to be very challenging to hold the precise gage of the floor. This resulted in non-uniform floor across the sleeve, causing degradation of printing integrity. Moreover, in the case of the thicker sleeves that were used, the amount of actinic light getting through was extremely small because the sleeve was opaque.

To overcome this, exposure of the floor layer 14 through the face and subsequent grinding, sanding etc to achieve the specification was found to be advantageous. Moreover, using this step achieved high adhesion to the sleeve surface without the use of primers/adhesives normally used in the art.

The floor layer 14 is preferably applied as a liquid extrudate polymer, using a knife or extrusion to ensure uniform thickness. Once applied, the layer is cured from the front using heat, actinic radiation and/or radiant energy to form a substantially continuous seamless layer over the outer surface of base 10 or the layer of compressible material 12 if used. If necessary, the floor layer 14 can then be sanded, ground or otherwise machined to the proper outside diameter. The thickness of the floor layer may range from about 5 mils to about 134 mils. When cured the floor layer 14, depending on the thickness and type of photopolymer should have a resilience of from 40% to 70% and a hardness of from 30 to 70 Shore A as measured by ASTM D2240.

Imageable layer 16 is formed from a material which can be imaged, either mechanically, optically, via heat or differential melting and/or chemically. Preferably, imageable layer 16 comprises a photocurable or photopolymerizable material. Again, in order to make a seamless layer, the photocurable material is applied to the floor layer 14 by spreading, dipping, casting, extruding or molding. The thickness is controlled either by using a knife, die or mold as appropriate. If necessary, the precise thickness of imageable layer 16 can be adjusted via grinding, sanding or other machining. If desired, more than one imageable layer can be sequentially applied.

The photocurable material for use in fabricating the floor layer 14 and the imageable layer 16 generally comprises binder(s), monomer(s) and photoinitiator(s). The binder preferably comprises an A-B-A type block copolymer where A represents a non-elastomeric block, preferably a vinyl polymer or most preferably polystyrene, and B represents an elastomeric block, preferably polybutadiene or polyisoprene. Preferably, the non-elastomer to elastomer ratio is in the range of from 10:90 to 35:65.

The photocurable material also comprises at least one monomer, which should be an ethylenically unsaturated compound. Suitable monomers include multi functional acrylates, multifunctional methacrylates and polyacryloyl oligomers. Examples of suitable monomers include one or more of ethylene glycol diacrylate, hexanediol diacrylate, diethylene glycol diacrylate, glycerol diacrylate, trimethylol propane triacrylate, hexane diol dimethacrylate, glycerol triacrylate, trimethylolpropane triacrylate, ethylene glycol dimethacrylate, 1,3-propanediol dimethacrylate, 1,2,4-butanetriol trimethacrylate, and 1,4-butanediol diacrylate. The photocurable material should also have at least one photoinitiator. Any of the known classes of photoinitiators, particularly free radical photoinitiators such as quinones, bemzophenones, benzoin ethers, aryl ketones, peroxides, biimidazoles, diacyliodoniums, triacylsulfoniums, phosphoniums, and diazoniums. In addition to the binder, monomer, and photoinitiator, the photocurable composition may also comprise other additives known in the art such as plasticizers, anti-oxidants, oxygen scavengers, flow modifiers, colorants and fillers.

Although the photocurable material noted above is preferred for fabricating the floor layer 14 and the imageable layer 16, any photocurable material useful in fabricating flexographic printing plates may be used. For additional examples of photocurable materials useful in this regard, please refer to U.S. Pat. Nos. 4,045,231; 4,323,636; 5,223,375; and 5,290,633, the teachings each of which are incorporated herein by reference in their entirety. The imageable layer usually ranges from about 15 mil to 35 mil depending on the printing application.

On top of the imageable layer is optionally, but preferably, a masking layer 18. The purpose of the masking layer 18 is to allow for the selective polymerization of the imageable layer. Thus, the masking layer 18 must be made to be removed or become transparent to actinic radiation in areas where the imageable layer 16 is to be polymerized, but at the same time block actinic radiation in areas where the imageable layer is to remain unpolymerized and developed away to create the relief image necessary for flexographic printing.

Preferably, the masking layer can be selectively ablated using laser radiation in the pattern of the image desired. In the case of laser ablation, the masking layer generally comprises an ultraviolet radiation absorbing material, an infra-red radiation absorbing material and a binder. Dark inorganic pigments such as carbon black or graphite can function as both the ultraviolet radiation absorbing material and infra-red radiation absorbing material. Polyamides or cellulosic polymers are suitable binders. Suitable masking layers are described in U.S. Pat. Nos. 6,605,410 and 6,238,837, the teachings each of which are incorporated herein by reference in their entirety.

The masking layer can be disposed on the imageable layer 16 using several methods. It can be spread directly on the imageable layer 16 and dried. It can be separately spread on a plastic cover sheet and the coversheet laminated to the imageable layer 16 with the masking layer 18 between the imageable layer 16 and the coversheet. In this case, the coversheet is stripped away before use. The masking layer must be removable using the development means used to develop away (remove) the uncured portions of the imageable layer. The masking layer usually ranges from about 1 $\mu$m to about 10 $\mu$m and having an optical density of from 2.5 to 4.5.

The printing sleeve can be utilized in the following manner:

1. The masking layer 18 is selectively exposed to laser radiation at a wavelength and power such that the portions of masking layer contacted with the laser radiation are ablated away without damaging the underlying imaging layer 16. Preferably the laser is computer controlled to scan the surface of the masking layer 18 according to the image desired. In this regard, please refer to U.S. Pat. No. 5,760,880, the disclosure of which is incorporated herein by reference in its entirety.

2. The surface of the printing sleeve is then exposed to actinic radiation such that the portions of the imaging layer 16 that have been exposed as a result of the ablation of portions of the masking layer 18 above are polymerized, but the portions of the imaging layer 16 that remain covered by masking layer 18 remain unpolymerized.

3. The printing sleeve is subjected to development using heat and/or chemicals such that the masking layer and the unpolymerized portions of the imaging layer are removed leaving behind the polymerized portions of the imaging layer standing out in relief in the image desired.

4. Optionally, further post-curing and detacking the remaining imaging layer using actinic radiation or heat.

5. Fitting the printing sleeve onto a printing cylinder using high pressure air to temporarily expand the inside diameter of the printing sleeve and then removing the high pressure air so that the printing sleeve contracts to fit onto the printing cylinder.

6. Optionally, fitting the above printing sleeve onto a bridge cylinder using high pressure air to temporarily expand the inside diameter of the printing sleeve and then removing the high pressure air so that the printing sleeve contracts to fit onto the bridge cylinder. The bridge cylinder then acts as the printing construction. A suitable example of a bridge cylinder is Eliminator™ available from MacDermid Printing Solutions 7. Installing the printing cylinder in a flexographic printing press to begin printing.

EXAMPLE I

The mandrel is inspected for imperfections or defects and thoroughly cleaned. A mold release is applied to the mandrel and pre-heated to 100° to 120° F. The epoxy resin and hardener (Ratio approximately 3.3:1) is mixed by hand for 1–2 minutes until it thickens. This resin-hardener mixture is then applied to the mandrel. Type 106-glass fabric pre-cut into 4-inch width is then wrapped around mandrel to be sure that the fabric is totally wetted out. The polymer-glass composite is then allowed to crosslink or gel by applying heat for about 30 minutes. The sleeve is removed from the mandrel while the sleeve and mandrel are still hot by introducing compressed air between the sleeve and mandrel to assist with the removal. The sleeve is then baked for 4 hours at 120° F. After the baking step the sleeve is further machined or ground to the specified gage (16±-½ mil wall thickness).

A floor layer (Table I) is first extruded onto either of the hollow cylindrical base. The floor layer is then cured with either UV actinic radiation or by electron beam radiation. It is then ground to the specified gage required for the floor (at least 20–40 mils thick). The photopolymer imageable layer (Table II) is then extruded on top of the floor layer. This is then ground to the specific gage required (usually 20–25 mils). A mask layer is further applied on top of the photopolymer using a roller coating operation.

TABLE I

| INGREDIENT | WEIGHT % |
| --- | --- |
| Kraton ® D1102[1.] | 57.4 |
| Shellflex ® 6371[2.] | 21.2 |
| HDDA[3.] | 5.30 |
| TMPTMA[4.] | 5.30 |
| Irgacure ® 651[5.] | 3.30 |
| BHT[6.] | 2.27 |
| Irganox ® 1010[7.] | 0.03 |
| Calcium Stearate | 0.13 |
| Tinuvin ® 1130 | 0.01 |
| Microspheres | 5.00 |
|  | 100.0 |

[1.]Trademark of and available from Kraton Polymer Company
[2.]Trademark of and available from Shell Chemical Company
[3.]hexane dioldiacrylate
[4.]trimethylolpropane trimethacrylate
[5.]Trademarks of and available from Ciba Specialty Chemicals
[6.]butyleted hydroxytoluene
[7.]Trademarks of and available from Ciba Specialty Chemicals
[8.]Trademarks of and available from Ciba Specialty Chemicals

TABLE II

| INGREDIENT | WEIGHT % |
| --- | --- |
| Kraton ® D1102 | 60.46 |
| Shellflex ® 6371 | 22.33 |
| HDDA | 5.58 |
| TMPTMA | 5.58 |
| Irgacure ® 651 | 3.48 |
| BHT | 2.39 |
| Irganox ® 1010 | 0.03 |
| Calcium Stearate | 0.14 |
| Tinuvin ® 1130 | 0.01 |
|  | 100.0 |

What is claimed is:

1. A hollow cylindrical printing sleeve with an integral imageable printing surface comprising:
   a. a hollow cylindrical base;
   b. a substantially continuous floor layer comprised of a cured polymer selected from the group consisting of photopolymers, and polymers with a resilience of at least 40% when cured; and
   c. at least one layer of an imageable material.

2. A printing sleeve according to claim 1 wherein the base comprises a cured polymer resin which is expandable using a fluid pressure of less than about 100 psi and which contracts to its original size when the fluid pressure is removed.

3. A printing sleeve according to claim 1 wherein the printing sleeve also comprises a layer of compressible material.

4. A printing sleeve according to claim 1 wherein the floor layer comprises a photopolymer.

5. A printing sleeve according to claim 1 wherein the imageable material comprises a photopolymer.

6. A printing sleeve according to claim 1 wherein the printing sleeve also comprises a masking layer on top of the outermost surface of imageable material.

7. A printing sleeve according to claim 1 wherein the base is substantially uniformly transparent or translucent to actinic radiation.

8. A printing sleeve according to claim 2 wherein the base comprises a fiber reinforced polymer.

9. A printing sleeve according to claim 3 wherein the compressible material has a Shore A hardness of from 30 to 70 and a resilience of from 40 to 70%.

10. A printing sleeve according to claim 4 wherein the photopolymer comprises an A-B-A type block copolymer.

11. A printing sleeve according to claim 5 wherein the photopolymer comprises an A-B-A type block copolymer.

12. A printing sleeve according to claim 6 wherein the masking layer is selectively ablatable using laser energy at a selected wavelength and power.

13. A printing sleeve according to claim 5 wherein the printing sleeve also comprises a masking layer on top of the outermost layer of imageable material.

14. A printing sleeve according to claim 13 wherein the base comprises fiber reinforced polymer.

15. A printing sleeve according to claim 13 wherein the base is substantially uniformly transparent or translucent to actinic radiation.

16. A printing sleeve according to claim 14 wherein the photopolymer comprises an A-B-A type copolymer.

17. A printing sleeve according to claim 14 wherein the masking layer is selectively ablatable using laser energy at a selected wavelength and power.

18. A printing sleeve according to claim 1 wherein the floor layer also comprises microspheres.

19. A hollow cylindrical printing sleeve with an integral imageable printing surface comprising:
   (a) a hollow cylindrical base which is substantially uniformly transparent or translucent to actinic radiation;
   (b) at least one layer of an imageable material on the outer surface of the base, wherein said imageable material comprises a photopolymer wherein the base comprises a cured polymer resin which is expandable using fluid pressure of less than about 100 psi and which contracts to its original size when the fluid pressure is removed.

20. A printing sleeve according to claim 19 wherein the printing sleeve also comprises a masking layer on top of the outermost layer of imageable material.

21. A printing sleeve according to claim 19 wherein the photopolymer comprises an A-B-A type block copolymer.

22. A printing sleeve according to claim 20 wherein the masking layer is selectively ablatable using laser energy at a selected wavelength and power.

23. A printing sleeve according to claim 22 wherein the photopolymer comprises an A-B-A type block copolymer.

24. A printing sleeve according to claim 19 wherein the sleeve also comprises a substantially continuous floor layer between the hollow cylindrical base and the at least one layer of imageable material, wherein said floor layer is substantially uniformly transparent or translucent to actinic radiation and where said floor layer is comprised of a cured polymer selected from the group consisting of photopolymers, and polymers with a resilience of at least 40% when cured.

25. A printing sleeve according to claim 24 wherein said floor layer also comprises micropheres.

\* \* \* \* \*

(12) EX PARTE REEXAMINATION CERTIFICATE (8685th)
United States Patent
Kanga et al.

(10) Number: US 6,966,259 C1
(45) Certificate Issued: Nov. 22, 2011

(54) PRINTING SLEEVE WITH AN INTEGRATED PRINTING SURFACE

(75) Inventors: Rustom S. Kanga, Marietta, GA (US); Mark A. Borski, Gresham, OR (US); Patricia I. Janssen, Elkton, MD (US)

(73) Assignee: Macdermid Printing Solutions, LLC, Waterbury, CT (US)

Reexamination Request:
No. 90/008,004, Jun. 29, 2006

Reexamination Certificate for:
Patent No.: 6,966,259
Issued: Nov. 22, 2005
Appl. No.: 10/754,297
Filed: Jan. 9, 2004

(51) Int. Cl.
*B41N 1/00* (2006.01)
*B41N 1/12* (2006.01)

(52) U.S. Cl. .................. 101/395; 101/376; 101/493; 430/296

(58) Field of Classification Search .................. None
See application file for complete search history.

(56) References Cited

To view the complete listing of prior art documents cited during the proceeding for Reexamination Control Number 90/008,004, please refer to the USPTO's public Patent Application Information Retrieval (PAIR) system under the Display References tab.

*Primary Examiner*—B. James Peikari

(57) ABSTRACT

A seamless printing sleeve comprising a hollow cylindrical base and a seamless imageable surface as its outermost layer is described. The imageable surface acts as an integral flexographic printing surface. Preferably the printing sleeve comprises an intermediate photopolymer or resilient polymer layer between the outer surface of the base and the imageable surface. Also, preferably the base is uniformly transparent or translucent to actinic radiation.

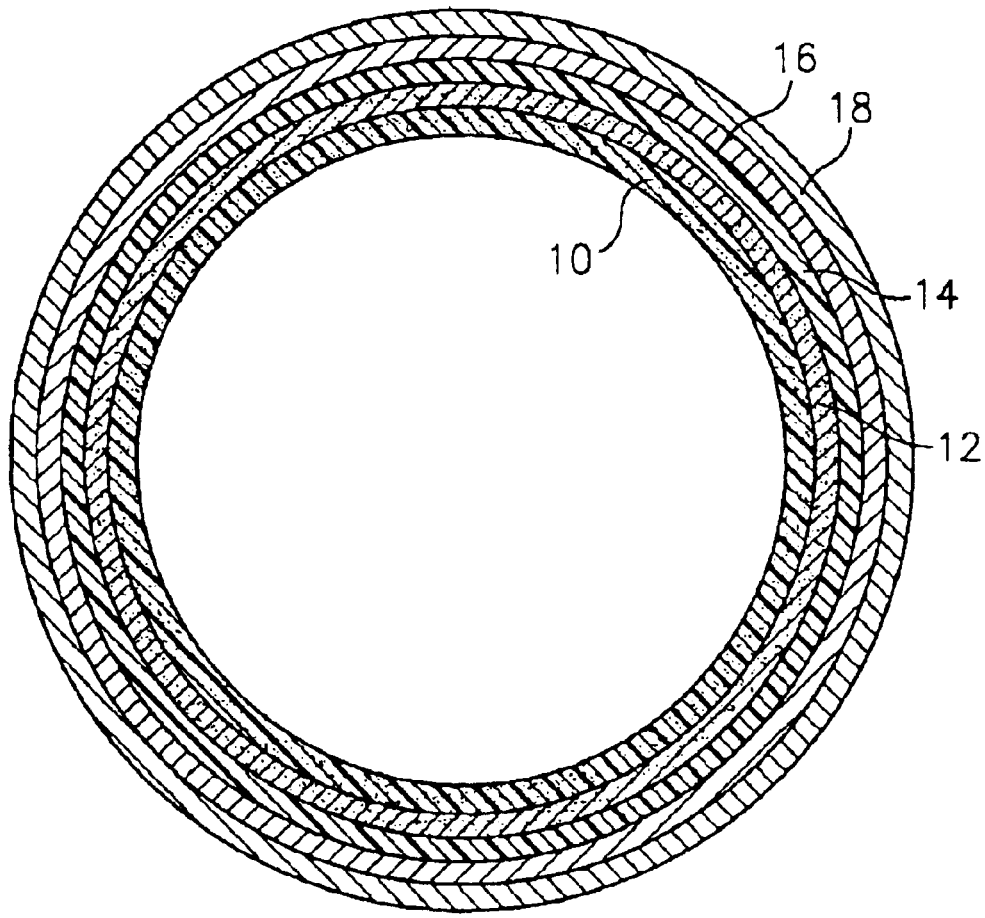

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 19-23 are cancelled.

Claims 1, 3 and 24 are determined to be patentable as amended.

Claims 2, 4-18 and 25, dependent on an amended claim, are determined to be patentable.

New claims 26-38 are added and determined to be patentable.

1. A hollow cylindrical printing sleeve with an integral imageable printing surface comprising:
   a. a hollow cylindrical base;
   b. a substantially continuous *cured* floor layer comprised of a cured polymer selected from the group consisting of photopolymers[,] and polymers with a resilience of at least 40% when cured; and
   c. at least one layer of an imageable material.

3. A printing sleeve according to claim 1 wherein the printing sleeve [also] comprises a layer of compressible material *between the hollow cylindrical base and the substantially continuous cured floor layer*.

24. A printing sleeve according to claim 19 wherein the sleeve also comprises a substantially continuous *cured* floor layer between the hollow cylindrical base and the at least one layer of imageable material, wherein said *cured* floor layer is substantially uniformly transparent or translucent to actinic radiation and where said floor layer is comprised of a cured polymer selected from the group consisting of photopolymers[,] and polymers with a resilience of at least 40% when cured.

*26. The printing sleeve according to claim 3, wherein the compressible layer is selected from the group consisting of solid foam materials, microsphere compressible foam materials and soft resilient polymers.*

*27. The printing sleeve according to claim 26, wherein the microsphere compressible foam material comprises hollow microspheres mixed with an uncured photopolymer or thermally curable resin and is cured in place on the hollow cylindrical base.*

*28. The printing sleeve according to claim 4, wherein the substantially continuous cured floor layer comprises microspheres.*

*29. The printing sleeve according to claim 1, wherein the printing sleeve does not contain an adhesive layer between the hollow cylindrical base and the cured floor layer.*

*30. The printing sleeve according to claim 1, wherein the substantially continuous cured floor layer comprises microspheres.*

*31. A hollow cylindrical printing sleeve with an integral imageable printing surface comprising, in order:*
   *(a) a hollow cylindrical base;*
   *(b) a layer of cured compressible material on the hollow cylindrical base, wherein the layer of compressible material comprises microspheres;*
   *(c) a substantially continuous cured floor layer on the layer of compressible material, wherein the substantially continuous floor layer comprises a cured polymer selected from the group consisting of photopolymers and polymers having a resilience of at least 40% when cured; and*
   *(d) at least one layer of an imageable material on the substantially continuous cured floor layer.*

*32. A hollow cylindrical printing sleeve with an integral imageable printing surface comprising, in order:*
   *(a) a hollow cylindrical base which is substantially uniformly transparent or translucent to actinic radiation;*
   *(b) a substantially continuous cured floor layer having a hardness of 30 to 70 Shore A; and*
   *(c) at least one layer of an imageable material on an outer surface of the cured floor layer;*
   *wherein said imageable material comprises a photopolymer and wherein the base comprises a cured polymer resin which is expandable using fluid pressure of less than about 100 psi and which contracts to its original size when the fluid pressure is removed.*

*33. A method of making a hollow cylindrical printing sleeve with an integral imageable printing surface, wherein the hollow cylindrical printing sleeve comprises (i) a hollow cylindrical base; (ii) a substantially continuous floor layer comprising a cured polymer selected from the group consisting of photopolymers and polymers with a resilience of at least 40% when cured; and (iii) at least one layer of an imageable material; the method comprising the steps of:*
   *(a) providing a hollow cylindrical base;*
   *(b) applying a substantially continuous layer of a photopolymer or a resilient polymer on an outer surface of the hollow cylindrical base;*
   *(c) curing the substantially continuous layer of photopolymer or resilient polymer to create a substantially continuous cured floor layer; and*
   *(d) applying at least one layer of an imageable material on top of the cured floor layer.*

*34. The method according to claim 33, comprising the step of applying a layer of compressible material on the outer surface of the hollow cylindrical base prior to applying the substantially continuous layer of photopolymer or resilient polymer.*

*35. The method according to claim 34, comprising the step of curing the layer of compressible material prior to applying the substantially continuous layer of photopolymer or resilient polymer.*

*36. The method according to claim 34, wherein the layer of compressible material comprises microspheres.*

*37. The method according to claim 33, wherein the substantially continuous floor layer comprises microspheres.*

*38. The method according to claim 33, wherein in the step of curing the substantially continuous layer of a photopolymer or resilient polymer to create a substantially continuous cured floor layer, the curing occurs as a result of exposure through a front surface.*

* * * * *